United States Patent
Streubel et al.

(10) Patent No.: US 6,784,027 B2
(45) Date of Patent: Aug. 31, 2004

(54) LIGHT-EMITTING SEMICONDUCTOR COMPONENT

(75) Inventors: Klaus Streubel, Laaber (DE); Ralph Wirth, Regensburg (DE)

(73) Assignee: Osram Opto Semiconductors GmbH, Erlangen (DE)

(*) Notice: Subject to any disclaimer, the term of this patent is extended or adjusted under 35 U.S.C. 154(b) by 0 days.

(21) Appl. No.: 10/308,079

(22) Filed: Dec. 2, 2002

(65) Prior Publication Data

US 2003/0164505 A1 Sep. 4, 2003

(30) Foreign Application Priority Data

Nov. 30, 2001  (DE) .......................................... 101 58 754

(51) Int. Cl.$^7$ ............................................. H01L 21/44
(52) U.S. Cl. ........................... 438/122; 438/22; 438/46; 438/26; 438/119; 438/121
(58) Field of Search .............................. 438/22, 26, 46, 438/119, 121, 122

(56) References Cited

FOREIGN PATENT DOCUMENTS

| GB | 2 233 152 A | 1/1991 |
|----|----|----|
| JP | 57 072 336 A | 5/1982 |
| JP | 61 110 476 A | 5/1986 |
| JP | 07 086 470 A | 3/1995 |

*Primary Examiner*—Long Pham
(74) *Attorney, Agent, or Firm*—Laurence A. Greenberg; Werner H. Stemer; Gregory L. Mayback

(57) ABSTRACT

A light-emitting semiconductor component having: a semiconductor element containing an active layer, electrical contacts for impressing a current into the active layer (heat being generated at the active layer and at the electrical contacts during operation), and a carrier with a large thermal capacity for absorbing the heat generated during operation. The rear side of the semiconductor element is electrically and thermally connected to the carrier by a conductive adhesive. Recesses, which accommodate a part of the conductive adhesive when the semiconductor element is connected to the carrier, are provided in the rear side of the semiconductor element.

28 Claims, 3 Drawing Sheets

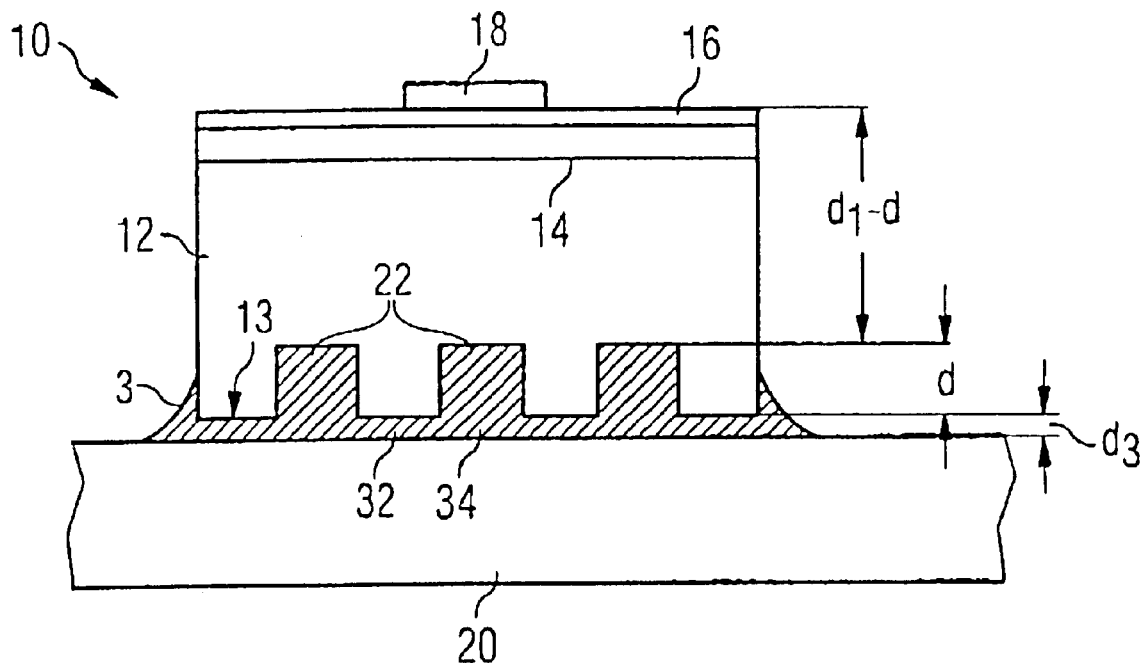
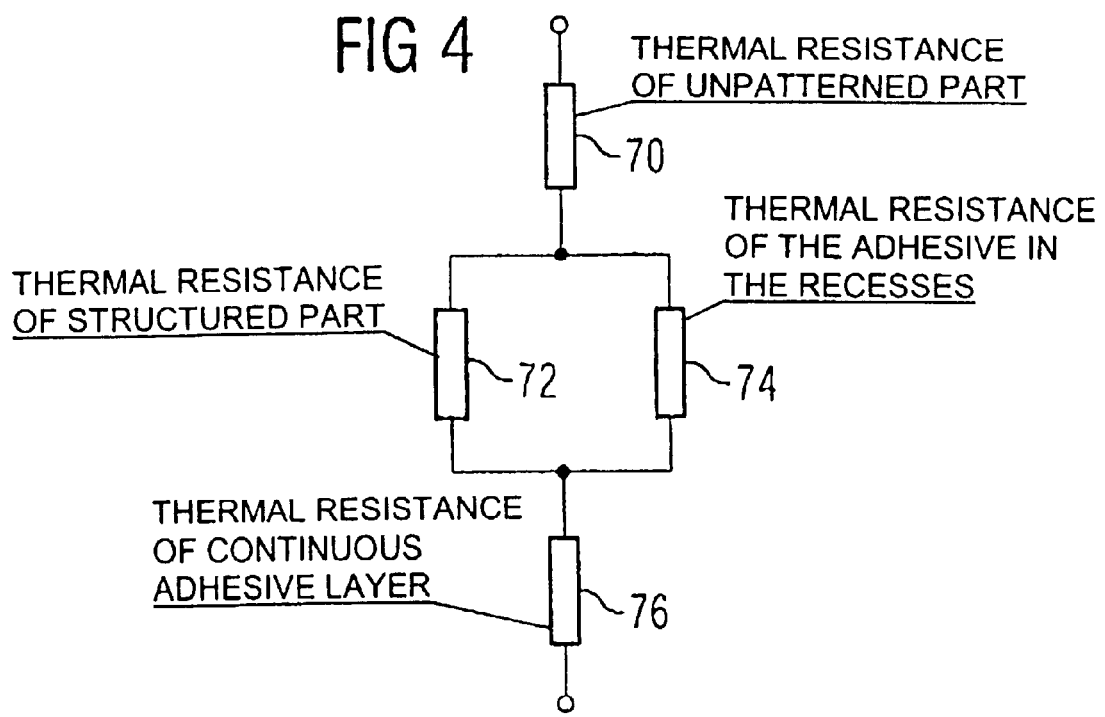

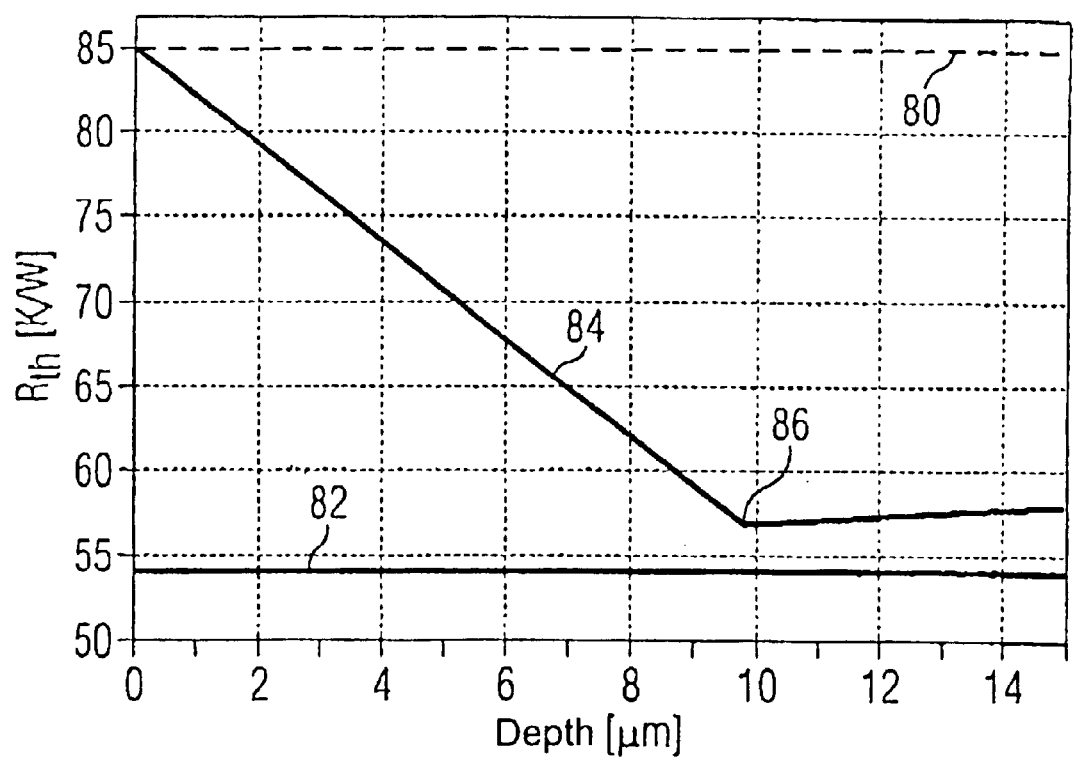

LIGHT-EMITTING SEMICONDUCTOR COMPONENT

BACKGROUND OF THE INVENTION

Field of the Invention

The invention relates to a light-emitting semiconductor component having a semiconductor element with an active layered structure, electrical contacts for impressing a current into the active layered structure, a carrier acting as a heat sink for the semiconductor element, and a conductive adhesive electrically and thermally connecting the semiconductor element to the carrier.

During operation of such a semiconductor component, waste heat is generated in the semiconductor element, in particular in its active layer, which is for example, a pn-type junction, and at the electrical contacts for impressing a current into the active layer. In order to conduct this heat away to the carrier that functions as a heat sink and that has the largest possible thermal capacity, one of the side faces of the semiconductor element is generally connected to the carrier.

In this context there is the problem that, when electrically conductive adhesives that are conventionally available for this purpose are used to conductively mount the semiconductor element on the carrier, the layer of conductive adhesive, which typically has a thickness of 5 $\mu$m to 10 $\mu$m, significantly increases the overall thermal resistance $R_{th}$ between the active region of the LED chip and the carrier that serves as a heat sink. This leads to a reduction of the flow of heat into the heat sink and causes the occurrence of relatively high temperatures, which ultimately restrict the achievable optical power, in the active region of the component.

Hitherto, this increased thermal resistance has been accepted in most applications. In critical applications, other mounting techniques have been used, for example, the chips are soldered onto the carrier. However, this is associated with an increased degree of expenditure for mounting.

SUMMARY OF THE INVENTION

It is accordingly an object of the invention to provide a light-emitting semiconductor component of the type mentioned at the beginning, in which the thermal connection of the semiconductor element to the heat-absorbing carrier is improved as compared to the prior art semiconductor components of this type.

With the foregoing and other objects in view there is provided, in accordance with the invention, a light-emitting semiconductor component, including: a semiconductor element including an active layered structure; electrical contacts for impressing a current into the active layered structure; a carrier for the semiconductor element, the carrier acting as a heat sink; and a conductive adhesive electrically and thermally connecting the carrier to the semiconductor element. The semiconductor element has a side facing the carrier. This side, which is a rear side, is formed with a plurality of recesses for accommodating a portion of the conductive adhesive between the semiconductor element and the carrier.

According to the invention, in a light-emitting semiconductor component of the type mentioned at the beginning, recesses, which accommodate a part of the conductive adhesive when the semiconductor element is connected to the carrier, are provided in the side of the semiconductor element facing the carrier.

The conductive adhesives that are conventionally available for connecting the semiconductor element and the carrier generally have a much smaller thermal conductivity than the semiconductor material of the semiconductor element itself. In the invention, in order to reduce the problems associated with conducting heat away, the mounting side of the semiconductor element is patterned in such a way that during the connection (chip bonding), the adhesive can largely flow into the recesses that are provided. As a result, even when there is the same overall volume of adhesive, the layer of adhesive remaining between the recesses is dilated to such an extent that in these regions the layer of adhesive only has a small thermal resistance between the semiconductor element and the carrier and only makes a small contribution to the overall thermal resistance between the active layer and the carrier.

The thermal resistance of the adhesive that has flowed into the recess is itself largely bridged by the semiconductor material having a higher thermal conductivity which now extends in regions almost as far as the carrier. This results overall in a significantly reduced overall thermal resistance.

The recesses are preferably formed as elongated trenches with, for example, a square, rectangular, triangular, or trapezoidal cross section. This permits the rear side of the semiconductor element to be structured easily, for example, by sawing, milling, or etching.

The recesses can preferably also be produced in the form of square, pyramid-shaped, or conical pits. This also permits easy structuring of the rear side of the semiconductor element.

In conventional semiconductor elements that are mounted on the carrier by their substrate on which the active layer is located, it has proven expedient if the recesses have a depth of 2 $\mu$m to 80 $\mu$m, preferably of 5 $\mu$m to 40 $\mu$m, particularly preferably of approximately 10 $\mu$m to approximately 20 $\mu$m.

Likewise, the recesses can advantageously have a depth of 1% to 40%, preferably of 2% to 20%, particularly preferably of approximately 5% to approximately 10%, of the thickness of the semiconductor element. Here, the depth of the recesses is measured from the rear-side surface of the semiconductor element from which the recesses extend into the semiconductor element.

Advantageously 10% to 90%, preferably 25% to 75%, particularly preferably approximately 40% to approximately 60%, of the rear side of the semiconductor element is occupied.

Here, the degree of occupancy is the ratio between the area of the rear side of the semiconductor element that remains between the recesses to the overall area of the lower surface of the semiconductor element including the recesses. If, for example, recesses with an overall area of 40,000 $\mu m^2$ (for example 16 square recesses with a surface area of 50×50 $\mu m^2$) are introduced into an LED chip with an area of 300×300 $\mu m^2$=90,000 $\mu m^2$, a degree of occupancy of 5/9= 55.5% results from the remaining unpatterned area of, 50,000 $\mu m^2$.

The entire output surface of the recesses and the depth of the recesses are inversely proportional to one another. If, for example, a greater depth of the recesses is selected, a smaller output surface is enough to absorb a sufficient quantity of conductive adhesive in the volume of the recesses. Conversely, when the depth of the recesses is smaller, a larger output surface is generally necessary in order to achieve a significant reduction in the thermal resistance.

Basically, the depth and degree of occupancy of the recesses are proportional to the typical layer thickness of the conductive adhesive that is determined when a semiconductor element with the same area, but without recesses is applied. If a layer thickness of 5 μm, for example, is obtained with a specific adhesive, it is possible, for example with a degree of occupancy of 50%, to accommodate essentially the entire volume of adhesive of 10 μm-deep recesses. All that then remains is a thin continuous adhesive layer between the rear side of the semiconductor element and the carrier.

With this degree of occupancy, deeper recesses do not provide any further advantage as no additional adhesive can be accommodated, but the thermal resistance rises again because of the larger structured volume.

Flatter recesses do not accommodate the entire volume of adhesive, and in doing so leave a thicker continuous adhesive layer between the rear side of the semiconductor element and the carrier, thus resulting in a higher overall thermal resistance.

The same considerations apply if a different degree of occupancy is selected.

In one preferred refinement, the recesses on the rear side of the semiconductor element each have the same shape and output surface.

In particular, the recesses may be arranged on the rear side of the semiconductor element in the form of a regular grid. Both of the aforesaid measures lead to the heat being uniformly conducted away via the semiconductor/carrier boundary face, and permit simple processing.

In order to conduct the heat away as uniformly as possible, the recesses may be arranged on the rear side of the semiconductor element in an arrangement with the symmetry of the semiconductor component itself.

The depth and overall output surface of the recesses are advantageously selected in such a way that a continuous thin layer of the conductive adhesive remains between the rear side of the semiconductor element and the front side of the carrier.

Here, the continuous thin layer has, in preferred refinements, a thickness of 0.01 μm to 1 μm, where values of 0.05 μm to 0.25 μm are preferred.

In one refinement, the semiconductor element of the light-emitting semiconductor component includes a GaAs substrate.

Other features which are considered as characteristic for the invention are set forth in the appended claims.

Although the invention is illustrated and described herein as embodied in a light-emitting semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic sectional view of an exemplary embodiment of an LED that is attached to a carrier by a conductive adhesive;

FIG. 4 is an equivalent circuit diagram of the thermal resistance of the configuration shown in FIG. 3; and FIG. 5 is a graph showing the dependence of the thermal resistance on the depth of the recesses in the LED shown in FIG. 3, in which the recesses have a constant degree of occupancy of 50%.

DESCRIPTION OF THE PREFERRED EMBODIMENTS

Figure 1:
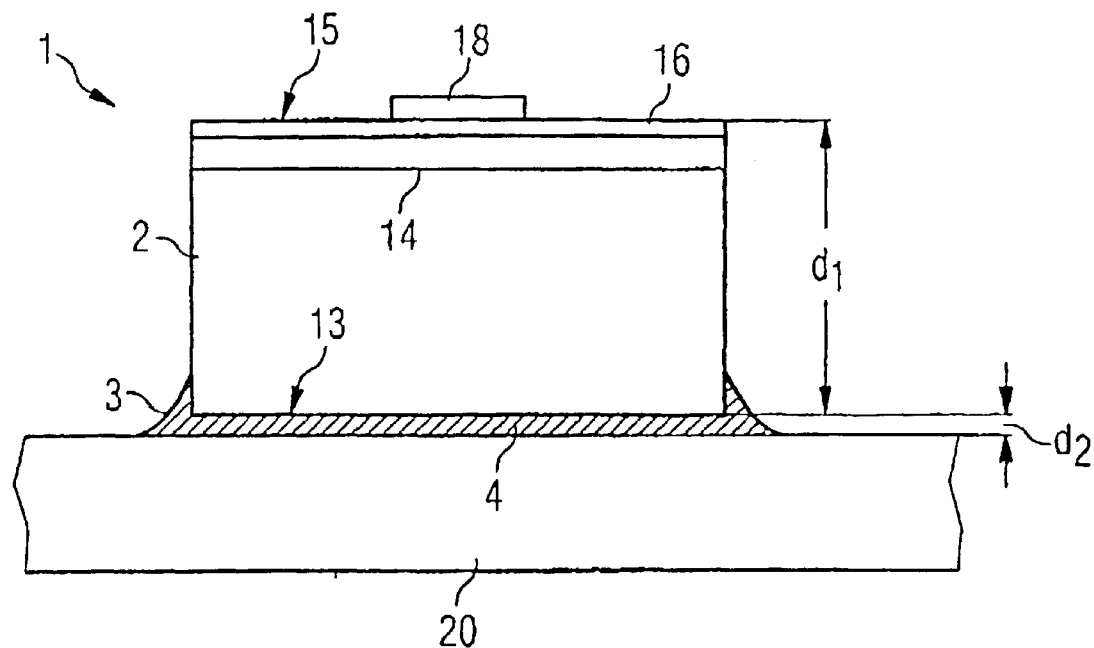
FIG. 1 is a schematic sectional view of a prior art LED that is attached to a carrier by a conductive adhesive.

Referring now to the figures of the drawing in detail and first, particularly, to FIG. 1 thereof, there is shown a prior art LED 1 for illustrating the initial problem. The semiconductor element 2 of the LED contains, as is customary for LEDs in the infrared, red or yellow spectral region, a GaAs substrate and an active layer 14, for example, a structure with a simple pn-type junction, a quantum well structure or a multiple quantum well structure.

Current is impressed into the active layer 14 via an n-side contact and a p-side contact (not illustrated). The p-side contact is more critical in terms of the generation of waste heat because of the higher specific resistance than the n-side contact. In the LED 1, the p-side contact has a metallic contact pad 18 and a current widening layer 16 for homogeneously broadening the current density over the area of the active layer 14 formed as a pn-type junction.

Waste heat, for example, as a result of non-radiating recombination processes or as a result of ohmic losses, is produced predominantly in the region of the pn-type junction 14 and of the p-side contact 16, 18 at the front side 15 of the LED chip 2.

For conducting away heat, the LED chip 2 is, inter alia, applied with a conductive adhesive 4 to a carrier 20 of an LED housing (not illustrated in more detail). The conductive adhesive brings about both a thermal connection and an electrical connection of the LED chip 2 and carrier 20.

As the bonded rear side 13 of the chip 2 is essentially planar, during the bonding, a continuous layer 4 of conductive adhesive which is uniform, apart from surface roughnesses, is typically produced with a thickness $d_2$ in the region of 5 μm to 10 μm between the chip and carrier. Outside the chip 2, thicker edge regions 3 are produced as a result of adhesive flowing out during the connection process. As the main heat sources are located near the front side 15 of the LED chip 2, the heat must cross virtually the entire thickness $d_1$ of the chip 2 and the layer of adhesive of thickness $d_2$ before it flows away into the carrier 20.

Figure 2:
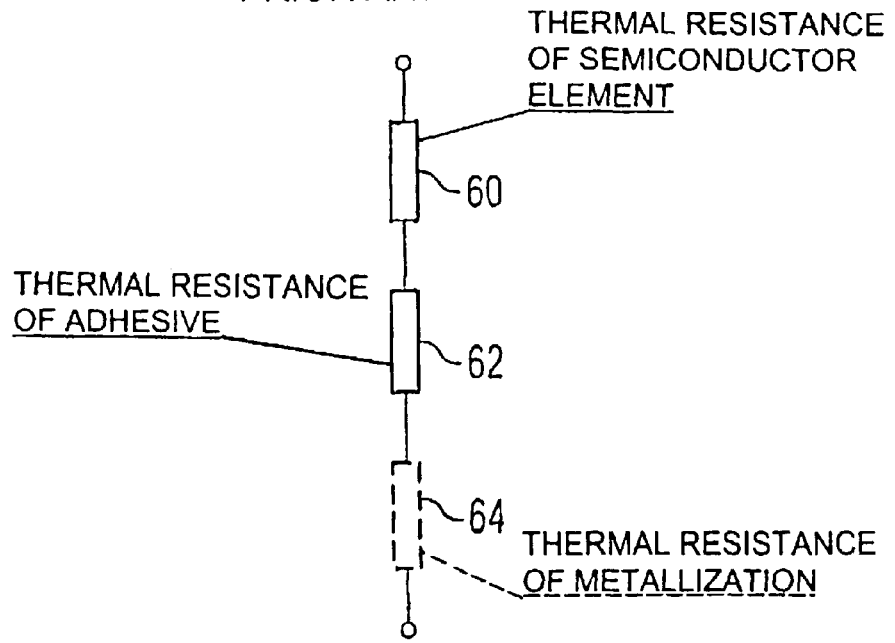
FIG. 2 is an equivalent circuit diagram of the thermal resistance of the configuration shown in FIG. 1.

FIG. 2 shows an equivalent circuit diagram of the thermal resistance of the configuration shown in FIG. 1. The reference symbol 60 designates the thermal resistance $R_{th}(SC)$ of the semiconductor element 2, which is obtained essentially using:

$$R_{th}(SC) = d_1 / (\lambda_{GaAs} * A),$$

$\lambda_{GaAs}$=46 W/(m*K) representing the thermal conductivity of the GaAs substrate, and A representing the cross-sectional area of the substrate perpendicular to the flow of heat.

The reference symbol 62 designates the thermal resistance $R_{th}$(adhesive) of the layer 4 of conductive adhesive, which is given by $$R_{th}(\text{adhesive}) = d_2 / (\lambda_{adhesive} * A),$$

the thermal conductivity of the conductive adhesive $\lambda_{adhesive}$ having a value in the region of 2 W/(m*K), and, for example, a value of 1.8 W/(m*K) for a typical conductive adhesive.

The proportion of the thermal resistance of the metallization of the rear side of the chip with respect to the thermal resistance (reference symbol 64) is small compared with the thermal resistances 60 and 62, and can therefore be ignored, as is indicated in FIG. 2 by the dashed lines.

As the thermal resistance of the conductive adhesive is smaller, by a factor of approximately 20, than that of the semiconductor material, the conductive adhesive layer contributes appreciably, despite its low thickness, to the overall thermal resistance:

$$R_{overall}(SdT)=R_{th}(SC)+R_{th}(\text{adhesive}).$$

Given a thickness of the semiconductor element of 220 $\mu$m and an area of 300×300 $\mu m^2$, an overall thermal resistance of $R_{overall}(SdT)=85$ K/W is obtained. The overall thermal resistance is made up of a proportion of the semiconductor element 2 of $R_{th}(SC)=54$ K/W, and a proportion of the conductive adhesive layer 4 of $R_{th}(\text{adhesive})=31$ K/W.

FIG. 3 shows an exemplary embodiment of a semiconductor component, specifically an LED designated generally by 10. Functionally identical elements are provided here with the same reference symbols as in FIG. 1 and are not explained again.

A number of recesses 22 are provided in the semiconductor element 12 of the LED 10 from the rear side 13—only three of these recesses are shown schematically in the illustration in FIG. 3. In the exemplary embodiment, the recesses 22 are arranged in the form of a regular rectangular grid which reflects the four-fold symmetry of the rectangular LED chip 12.

The recesses 22 are provided with a degree of occupancy of 50%, that is to say the entire output surface of the recesses 22 on the rear side 13 takes up a proportion of 50% of the entire area of the rear side 13. From the rear side 13, the recesses extend into the semiconductor element 12 to a depth d. They divide the semiconductor element 12 into a region without patterning having a thickness $d_1-d$ and into a patterned region of thickness d.

In the exemplary embodiment it was found that the conductive adhesive layer has a thickness of approximately 5 $\mu$m when a semiconductor element is bonded without recesses. Therefore, with a degree of occupancy of 50% a value of d=10 $\mu$m was selected for the depth of the recesses.

With this depth, the square recesses 22 can accommodate in their interior (reference symbol 34) essentially the entire volume of conductive adhesive that was arranged between the LED chip 2 and the carrier 20 as a conductive adhesive layer 4 with the conventional design in FIG. 1. Only one comparatively thin continuous conductive adhesive layer 32 of thickness $d_3$ remains between the rear side 13 of the semiconductor element and the front side of the carrier 20. The thickness $d_3$ here can be in the order of magnitude of between approximately 0.01 $\mu$m to 1 $\mu$m, and is preferably between approximately 0.05 $\mu$m and approximately 0.25 $\mu$m.

This configuration can be described by the equivalent circuit diagram for the thermal resistance that is given in FIG. 4. Here, in a way analogous to the representation in FIG. 2, the reference symbol 70 designates the thermal resistance $R_{th}$(unpatterned) of the unpatterned part of the semiconductor element 12, $$R_{th}(\text{unpatterned})=(d_1-d)/(\lambda_{GaAs}*A).$$

The reference symbol 72 designates the thermal resistance $R_{th}$(struct:HL) of the structured part of the semiconductor element 12, given by $$R_{th}(struct:HL)=d/(\lambda_{GaAs}*b*A),$$

where b represents the degree of occupancy. Reference symbol 74 characterizes the thermal resistance $R_{th}$ (struct:adhesive) of the conductive adhesive 34 which is accommodated in the recesses, with:

$$R_{th}(struct:\text{adhesive})=d/(\lambda_{adhesive}*(1-b)*A).$$

Reference symbol 76 finally designates the thermal resistance of the thin continuous conductive adhesive layer:

$$R_{th}(\text{adhesive})=d_3/(\lambda_{adhesive}*A).$$

In accordance with the selected geometry, the flow of heat flows in parallel through the patterned part of the substrate and the adhesive accommodated in the recesses so that the thermal resistance for this section is, as shown in the equivalent circuit diagram, given by parallel connection of the thermal resistances 72 and 74. The thermal resistances of the unpatterned part of the substrate 70 and of the continuous conductive adhesive layer 76 are in series with respect to this, as is indicated by the series connection in FIG. 4.

According to the invention, for the structure shown in FIG. 3 with a thickness of the semiconductor element 12 of $d_1=220$ $\mu$m, an area of 300×300 $\mu m^2$, an arrangement of the recesses with a degree of occupancy of 50%, that is to say b=0.5 and a depth of d=10 $\mu$m, and a thickness of the remaining continuous conductive adhesive layer of $d_3=0.1$ $\mu$m, the overall thermal resistance that is obtained is:

$$R_{overall}(Inv)=R_{th}(\text{unpatterned})+1/[1/R_{th}(struct:HL)+1/R_{th}(struct:\text{adhesive})]+R_{th}(\text{adhesive}).$$

Using the relationships stated, a thermal resistance of $R_{overall}(Inv)=57$ K/W is obtained. In comparison with the value of a conventional unpatterned LED chip of $R_{overall}(SdT)=85$ K/W, this value is considerably reduced, to almost the thermal resistance $R_{th}(SC)$ of the semiconductor element alone, which was determined above as 54 K/W. This means that, by means of the above-described patterning of the LED chip on its rear side (=mounting side toward the carrier), the proportion of the overall thermal resistance of the junction between the active layer and the carrier which originates from the conductive adhesive is reduced from the abovementioned value of 31 K/W to approximately 3 K/W, that is to say by approximately 90%.

FIG. 5 represents the profile of the overall thermal resistance $R_{ges}$ as a function of the depth of the recesses for the structure shown in FIG. 3 with a constant degree of occupancy of b=0.5. The reference symbol 80 indicates that the value of the overall resistance of the semiconductor element and the conductive adhesive without using patterning is 85 K/W. The reference symbol 82 indicates the lower limit—the thermal resistance of the semiconductor element 12 alone.

Here, the simulation is based on the assumption that the overall volume of the adhesive remains constant below the semiconductor element 12. That is to say that, when the LED chip is inserted into the adhesive, the amount of adhesive which is forced out to the side is not more or less than in a conventional LED without patterning. As long as sufficient adhesive is present between the LED chip and the carrier, in the present case for d<10 $\mu$m, a continuous adhesive layer of the thickness $d_3=d_2-b*d$ is assumed. For deeper structures for which $d_3$ would become zero or negative, a constant thickness of the remaining continuous adhesive layer of $d_3=0.1$ $\mu$m is assumed.

The profile 84 of the overall thermal resistance is then broken down into two parts. Starting from $R_{th}=85$ K/W, the thermal resistance initially decreases as the structure depth increases, until at approximately d=10 $\mu$m almost the entire volume of the adhesive is accommodated in the depressions in the patterning (reference symbol 86). The thermal resistance then assumes the abovementioned value of approximately 57 K/W, just above the thermal resistance of the element without any conductive adhesive.

For still greater depths of patterning, the thermal resistance increases again as the heat has to flow via higher and higher GaAs pillars without this effect being able to be compensated, as previously, by a further decrease in the thermal resistance of the continuous adhesive layer. This results in a minimum value of the overall thermal resistance, that is to say an optimum thickness for the selected degree of occupancy at a depth of patterning of approximately 10 $\mu$m.

It is apparent that the optimum depth depends on the selected degree of occupancy. For example, the optimum depth with a degree of occupancy of 75%, that is to say a proportion of the area of the recesses of 25%, is approximately 20 $\mu$m. Then, essentially the entire volume of adhesive is again accommodated by the recesses and only a thin residual layer remains between the semiconductor element and the carrier.

On the basis of the preceding information, one of ordinary skill in the art can easily select, without departing from the basic idea of the invention, a suitable combination of degree of occupancy and patterning depth which both results in a low overall thermal resistance and fulfills the requirement for patterning processes (no excessively deep recesses) which can be carried out satisfactorily and easily, and the requirement in terms of mechanical stability (no excessively small degree of occupancy).

We claim:

1. A light-emitting semiconductor component, comprising:
    a semiconductor element including an active layered structure;
    electrical contacts for impressing a current into said active layered structure;
    a carrier for said semiconductor element, said carrier acting as a heat sink; and
    a conductive adhesive electrically and thermally connecting said carrier to said semiconductor element;
    said semiconductor element having a side facing said carrier; and
    said side formed with a plurality of recesses for accommodating a portion of said conductive adhesive between said semiconductor element and said carrier.

2. The light-emitting semiconductor component according to claim 1, wherein:
    said semiconductor element includes a substrate carrying said active layered structure; and
    said plurality of said recesses are formed in said substrate.

3. The light-emitting semiconductor component according to claim 2, wherein said active layered structure is epitaxially grown onto said substrate.

4. The light-emitting semiconductor component according to claim 1, wherein said plurality of said recesses are formed as trenches.

5. The light-emitting semiconductor component according to claim 4, wherein each one of said trenches has a cross section selected from a group consisting of a square cross section, a rectangular cross section, a triangular cross section, and a trapezoidal cross section.

6. The light-emitting semiconductor component according to claim 1, wherein said plurality of said recesses are formed as pits.

7. The light-emitting semiconductor component according to claim 6, wherein each one of said plurality of said recesses has a shape selected from a group consisting of a square shape, a pyramid-shape, and a conical shape.

8. The light-emitting semiconductor component according to claim 1, wherein said plurality of said recesses are essentially completely filled with said conductive adhesive.

9. The light-emitting semiconductor component according to claim 1, wherein each one of said recesses has a depth between 2 $\mu$m and 80 $\mu$m, inclusively.

10. The light-emitting semiconductor component according to claim 1, wherein each one of said recesses has a depth between 5 $\mu$m and 40 $\mu$m, inclusively.

11. The light-emitting semiconductor component according to claim 1, wherein each one of said recesses has a depth between 10 $\mu$m and 20 $\mu$m, inclusively.

12. The light-emitting semiconductor component according to claim 1, wherein:
    said semiconductor component has a thickness; and
    each one of said plurality of said recesses has a depth between 1% and 40%, inclusively, of said thickness of said semiconductor component.

13. The light-emitting semiconductor component according to claim 1, wherein:
    said semiconductor component has a thickness; and
    each one of said plurality of said recesses has a depth between 2% and 20%, inclusively, of said thickness of said semiconductor component.

14. The light-emitting semiconductor component according to claim 1, wherein:
    said semiconductor component has a thickness; and
    each one of said plurality of said recesses has a depth between 5% and 10%, inclusively, of said thickness of said semiconductor component.

15. The light-emitting semiconductor component according to claim 1, wherein:
    said side of said semiconductor element has an overal area and a non-structured area; and
    a ratio between said non-structured area and said overall area is between 10% and 90%, inclusively.

16. The light-emitting semiconductor component according to claim 1, wherein:
    said side of said semiconductor element has an overal area and a non-structured area; and
    a ratio between said non-structured area and said overall area is between 25% and 75%, inclusively.

17. The light-emitting semiconductor component according to claim 1, wherein:
    said side of said semiconductor element has an overal area and a non-structured area; and
    a ratio between said non-structured area and said overall area is between 40% and 60%, inclusively.

18. The light-emitting semiconductor component according to claim 1, wherein each one of said plurality of said recesses has a shape and an output surface equivalent to that of all others of said plurality of said recesses.

19. The light-emitting semiconductor component according to claim 1, wherein said plurality of said recesses are configured in a regular grid.

20. The light-emitting semiconductor component according to claim 1, wherein said plurality of said recesses are symmetrically configured.

21. The light-emitting semiconductor component according to claim 1, wherein: said carrier has a front side facing said side of said semiconductor element; and said conductive adhesive includes a continuous thin layer configured between said side of said semiconductor element and said front side of said carrier.

22. The light-emitting semiconductor component according to claim 21, wherein said continuous thin layer has a thicknes between 0.01 $\mu$m and 1 $\mu$m, inclusively.

23. The light-emitting semiconductor component according to claim 21, wherein said continuous thin layer has a thickness between 0.05 µm and 0.25 µm, inclusively.

24. The light-emitting semiconductor component according to claim 1, wherein:
   said side of said semiconductor element has an overal area and a non-structured area;
   a ratio between said non-structured area and said overall area is between 10% and 90%, inclusively;
   said carrier has a front side facing said side of said semiconductor element;
   said conductive adhesive includes a continuous thin layer configured between said side of said semiconductor element and said front side of said carrier; and
   said continuous thin layer has a thicknes between 0.01 µm and 1 µm, inclusively.

25. The light-emitting semiconductor component according to claim 24, wherein said thickness of said continous thin layer is between 0.05 µm and 0.25 µm, inclusively.

26. The light-emitting semiconductor component according to claim 24, wherein said ratio between said non-structured area and said overall area is between 25% and 75%, inclusively.

27. The light-emitting semiconductor component according to claim 24, wherein said ratio between said non-structured area and said overall area is between 40% and 60%, inclusively.

28. The light-emitting semiconductor component according to claim 1, wherein said semiconductor element includes a GaAs substrate.

* * * * *